United States Patent
Chan

(10) Patent No.: US 8,008,679 B2
(45) Date of Patent: Aug. 30, 2011

(54) LIGHT EMITTING DIODE AND METHOD

(75) Inventor: Hsuan-Tang Chan, Cyonglin Township (TW)

(73) Assignee: Huga Optotech Inc., Taichung (TW)

( * ) Notice: Subject to any disclaimer, the term of this patent is extended or adjusted under 35 U.S.C. 154(b) by 294 days.

(21) Appl. No.: 12/329,816

(22) Filed: Dec. 8, 2008

(65) Prior Publication Data
US 2009/0224275 A1    Sep. 10, 2009

(30) Foreign Application Priority Data

Mar. 4, 2008  (TW) .............................. 97107442 A

(51) Int. Cl.
*H01L 33/00*    (2010.01)
(52) U.S. Cl. .............................. 257/98; 257/99; 257/100
(58) Field of Classification Search .................... 257/98, 257/99, 100
See application file for complete search history.

(56) References Cited

U.S. PATENT DOCUMENTS

| | | | |
|---|---|---|---|
| 4,280,273 A | | 7/1981 | Vincent |
| 5,181,084 A * | | 1/1993 | Bommer et al. ................. 257/94 |
| 2005/0224822 A1 * | | 10/2005 | Liu .................................. 257/84 |
| 2007/0278502 A1 * | | 12/2007 | Shakuda et al. ................. 257/88 |

* cited by examiner

*Primary Examiner* — Tan N Tran
(74) *Attorney, Agent, or Firm* — Snell & Wilmer L.L.P.

(57) ABSTRACT

A light emitting diode and methods of forming the same are provided. The light emitting diode includes an epitaxy chip having a first substrate, a first conductive semiconductor layer, a light emitting layer and a second conductive semiconductor layer on the first substrate; a second substrate holding the epitaxy chip; an isolation layer on the second substrate, the isolation layer having a first portion connecting to one side of the epitaxy chip and a second portion connecting to another side of the epitaxy chip; a first electrode on the first portion of the isolation layer; and a second electrode on the second portion of the isolation layer, wherein the first electrode and the second electrode respectively and electrically connect to the first conductive semiconductor layer and the second conductive semiconductor layer.

11 Claims, 7 Drawing Sheets

LIGHT EMITTING DIODE AND METHOD

CROSS REFERENCE TO RELATED APPLICATIONS

This application claims the right of priority based on Taiwan Patent Application No. 97107442 entitled "LIGHT EMITTING DIODE AND METHOD" filed on Mar. 4, 2008, which is incorporated herein by reference and assigned to the assignee herein.

FIELD OF THE INVENTION

This invention relates to a light emitting diode and manufacturing methods thereof, and more particularly relates to a light emitting diode with electrodes disposed over the isolation layer and manufacturing methods thereof.

BACKGROUND OF THE INVENTION

Light emitting diodes are widely applied in various fields such as illumination and display technologies due to their strengths of low costs, low power consumption, and compactness. In addition, LED structure is simple and can be easily incorporated into other devices.

FIG. 1 shows a conventional light emitting diode 10 including a substrate 11, an adhesion layer 12, an epitaxial structure 13, and electrodes 14, 15 on the epitaxial structure 13. Such a construction leads to good performance in current distribution, however, it also weakens light output intensity thereof because the electrodes 14, 15 may absorb or scatter light emitted upwards from the epitaxial structure 13. Enhancement of illumination has been a main issue in developing light emitting diode technology. Accordingly, a novel method capable of solving the aforementioned problems is desirable.

SUMMARY OF THE INVENTION

One embodiment of the invention discloses a light emitting diode in which a cathode or anode is disposed over the isolation layer surrounding the epitaxial structure, instead of being disposed directly on the epitaxial structure. In another embodiment, a transparent conductive layer is further provided to electrically connect the cathode, or the anode to a conductive semiconductor layer of the epitaxial structure. In doing so, light from a light emitting layer can be emitted directly, without being blocked by the cathode or the anode; thus, enhancement of illumination is achieved.

One aspect of the present invention is to provide a light emitting diode. The light emitting diode includes an epitaxy chip having a first substrate, a first conductive semiconductor layer, a light emitting layer and a second conductive semiconductor layer on the first substrate; a second substrate holding the epitaxy chip; an isolation layer on the second substrate, the isolation layer having a first portion connecting to one side of the epitaxy chip and a second portion connecting to another side of the epitaxy chip; a first electrode on the first portion of the isolation layer; and a second electrode on the second portion of the isolation layer, wherein the first electrode and the second electrode respectively and electrically connect to the first conductive semiconductor layer and the second conductive semiconductor layer.

Another aspect of the present invention is to provide a method of forming a light emitting diode. The method comprises providing at least one epitaxy chip, wherein the epitaxy chip has a first conductive semiconductor layer and a second conductive semiconductor layer; disposing the epitaxy chip over a first substrate; forming an isolation layer over the first substrate, wherein the isolation layer has a first portion connecting to one side of the epitaxy chip and a second portion connecting to another side of the epitaxy chip; and forming a first electrode and a second electrode over the isolation layer, wherein the first electrode electrically connects to the first conductive semiconductor layer, and the second electrode electrically connects to the second conductive semiconductor layer.

By way of the abovementioned aspects, the present invention provides a light emitting diode and methods of forming the same. The objects and the features of the present invention may best be understood by reference to the detailed description.

DETAILED DESCRIPTION OF THE INVENTION

Figure 1:
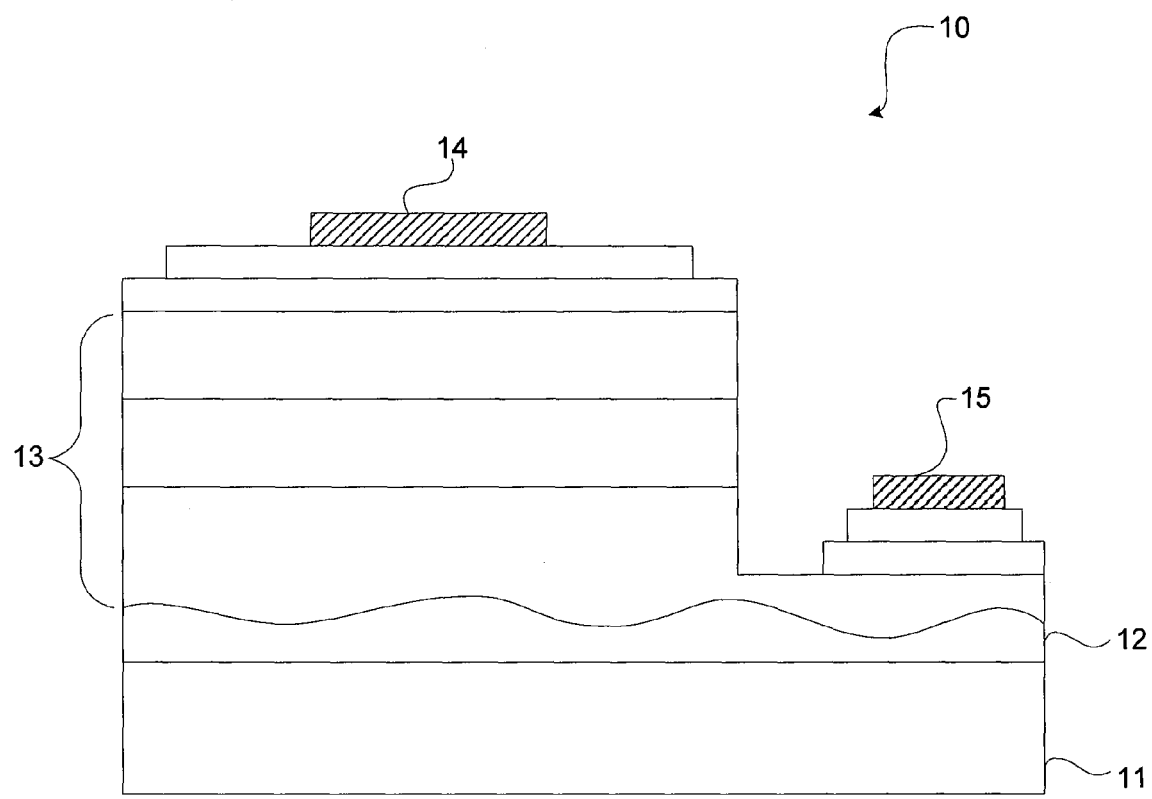
FIG. 1 is a cross-sectional view illustrating a conventional light emitting diode.

The preferred embodiments of the present invention will now be described in greater details by referring to the drawings that accompany the present application. It should be noted that the features illustrated in the drawings are not necessarily drawn to scale. Descriptions of well-known components, materials, and process techniques are omitted so as to not unnecessarily obscure the embodiments of the invention. Any devices, components, materials, and steps described in the embodiments are only for illustration and not intended to limit the scope of the present invention.

Figure 2A:
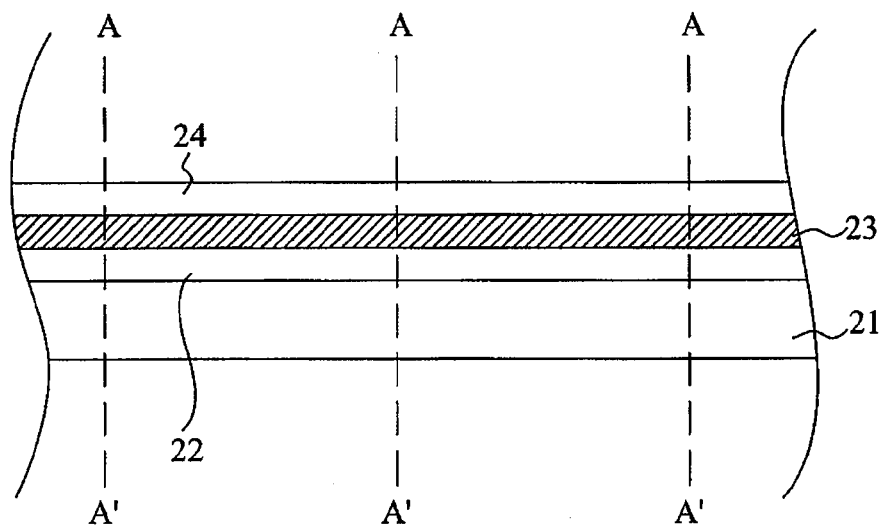
FIG. 2A, FIG. 2B and FIG. 3 to FIG. 10 are cross-sectional views illustrating the steps of manufacturing the light emitting diode in accordance with the present invention.
Figure 2B:
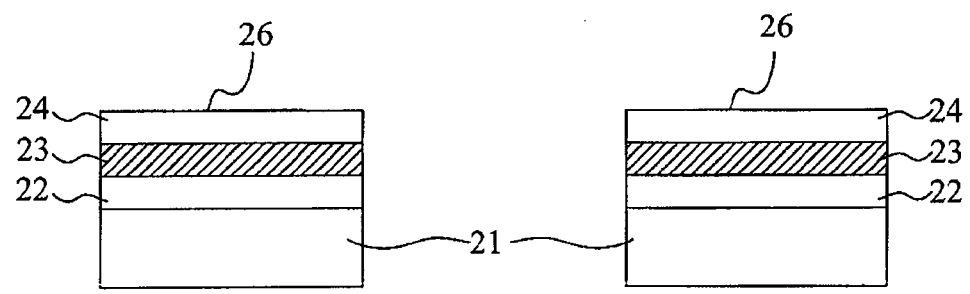

In one embodiment of the present invention, a method of forming a light emitting diode is disclosed. As shown in FIG. 2A to FIG. 2B, the method comprises providing an epitaxial structure that includes a first conductive semiconductor layer and a second conductive semiconductor layer. As shown in FIG. 2A, a substrate 21 such as n-type GaAs substrate is provided. Thereafter, the process proceeds to form an epitaxial stack over the substrate 21, and formation of the epitaxial stack includes disposing a first conductive semiconductor layer 22, a light emitting layer 23, and a second conductive semiconductor layer 24 over the substrate 21 in sequence. The first conductive semiconductor layer 22 can be an n-type epitaxial layer with the formula of $(Al_xGa_{1-x})_{0.5}In_{0.5}P$, and the light emitting layer 23 can be an undoped epitaxial layer with the formula of $(Al_xGa_{1-x})_{0.5}In_{0.5}P$, and the second conductive semiconductor layer 24 can be a p-type epitaxial layer with the formula of $(Al_xGa_{1-x})_{0.5}In_{0.5}P$. As to the light emitting layer 23, x refers to the level of Aluminum and is between 0 and 0.45. In the first conductive semiconductor layer 22 or the second conductive semiconductor layer 24, x is between 0.5 and 1.0. When x equals zero, the light emitting layer 23 is made of $Ga_{0.5}In_{0.5}P$ and emits visible light with wavelength of about 635 nm. In addition, the light emitting layer 23 can be of various types of structures such as homo-structure, single hetero-structure, double hetero-structure, or multiple quantum well structure. Note that, in other embodiments, the abovementioned epitaxial stack further includes other epitaxial layers.

Next, after appropriate cutting along the dashed line AA' in FIG. 1, a number of epitaxy chips 26 are obtained, as shown in FIG. 2B. The epitaxy chips 26 can be rectangular, triangular, oval, or circular.

Figure 3:
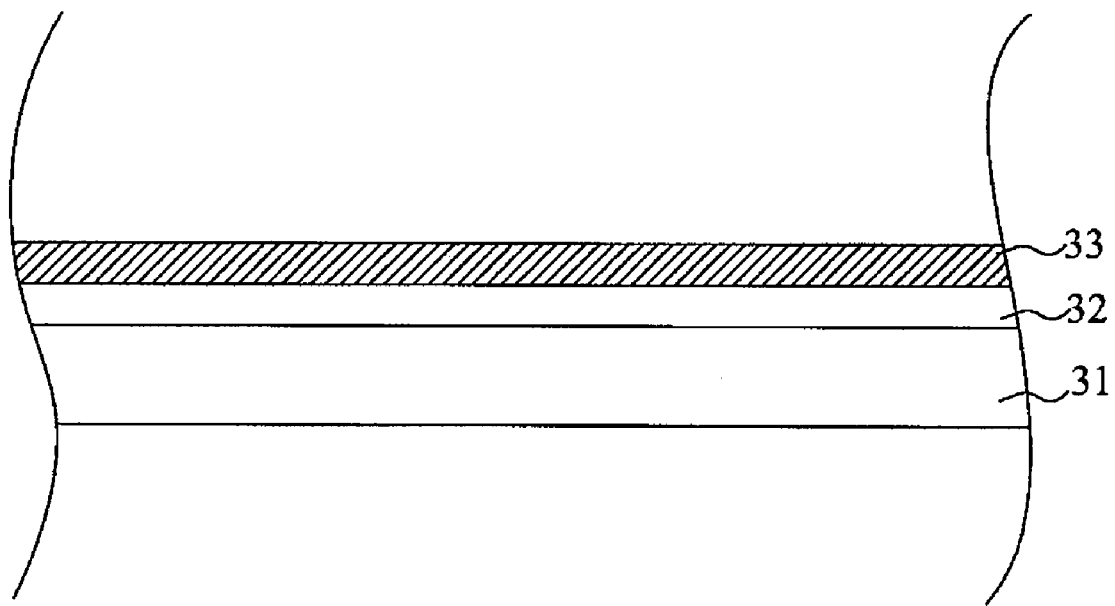

Referring to FIG. 3, another substrate 31 is provided. The substrate 31 can be glass substrate, Sapphire substrate, SiC substrate, GaP substrate, GaAsP substrate, ZnSe substrate, ZnS substrate, or ZnSSe substrate, but is not limited thereto. Next, a reflection layer 32 and an adhesion layer 33 are formed over the substrate 31 in order. The reflection layer 32 can be made of Sn, Al, Au, Pt, Zn, Ge, or Ag. The adhesion layer 33 can be made of spin-on glass, silicon resin, benzocyclobutene, epoxy, polyimide, or prefluorocyclobutene.

Figure 4:
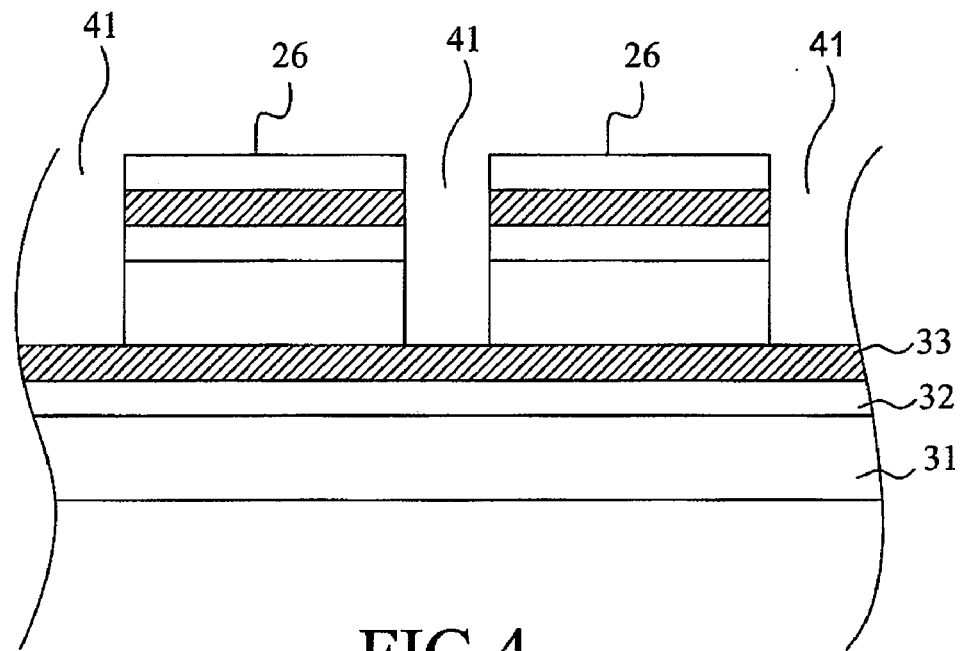

Referring to FIG. 4, by appropriate conventional skills, the epitaxy chips 26 are attached to the substrate 31 through the adhesion layer 33. Arrangement of the epitaxy chips 26 over the substrate 31 can have various modifications depending on the requirements, but there is at least a gap 41 between each other so that isolation materials can be filled therein later.

Figure 5:
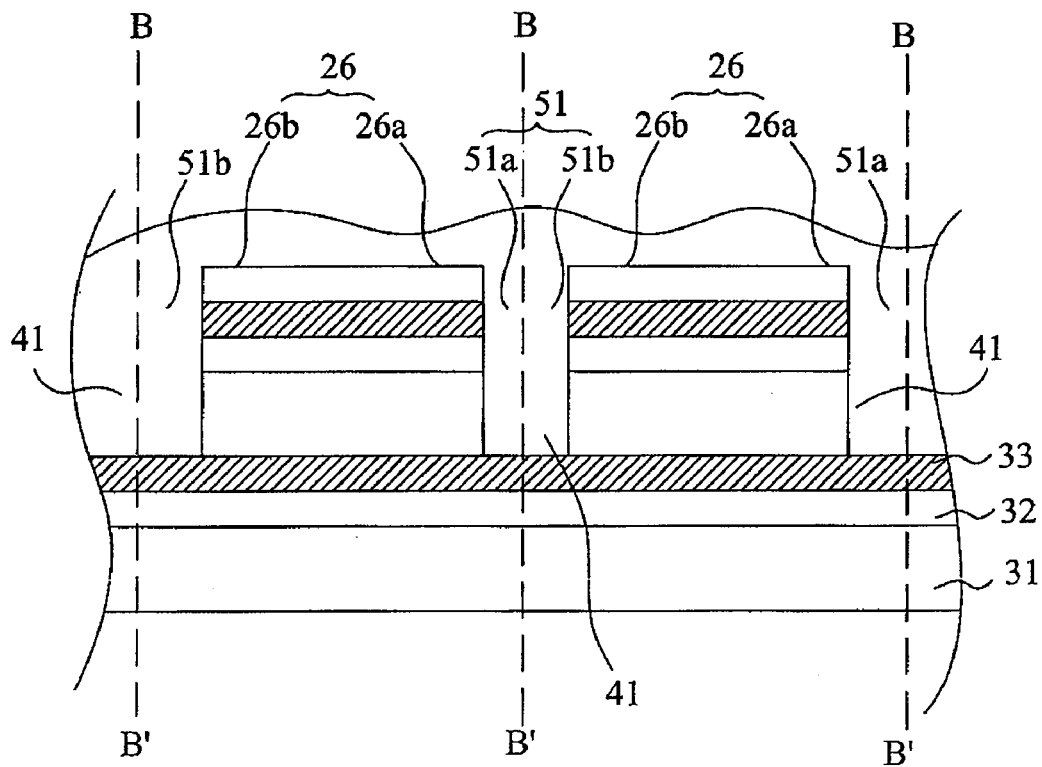

Referring to FIG. 5, an isolation layer 51 blanketly covers each epitaxy chip 26 and fills each gap 41 over the substrate 31. In doing so, the isolation layer 51 is formed with a first portion 51a connecting to a first side 26a of the epitaxy chips 26 and a second portion 51b connecting to a second side 26b of the epitaxy chips 26. Note that, in this embodiment, the gap 41 surrounds each epitaxy chip 26, and so does the isolation layer 51. The dashed line BB' in FIG. 5 is a cutting line, and each subsequent step will perform cutting along it after the invention is finished. Similar to the adhesion layer 33, the isolation layer 51 can be made of spin-on glass, silicon resin, benzocyclobutene, epoxy, polyimide, or prefluorocyclobutene.

Figure 6:
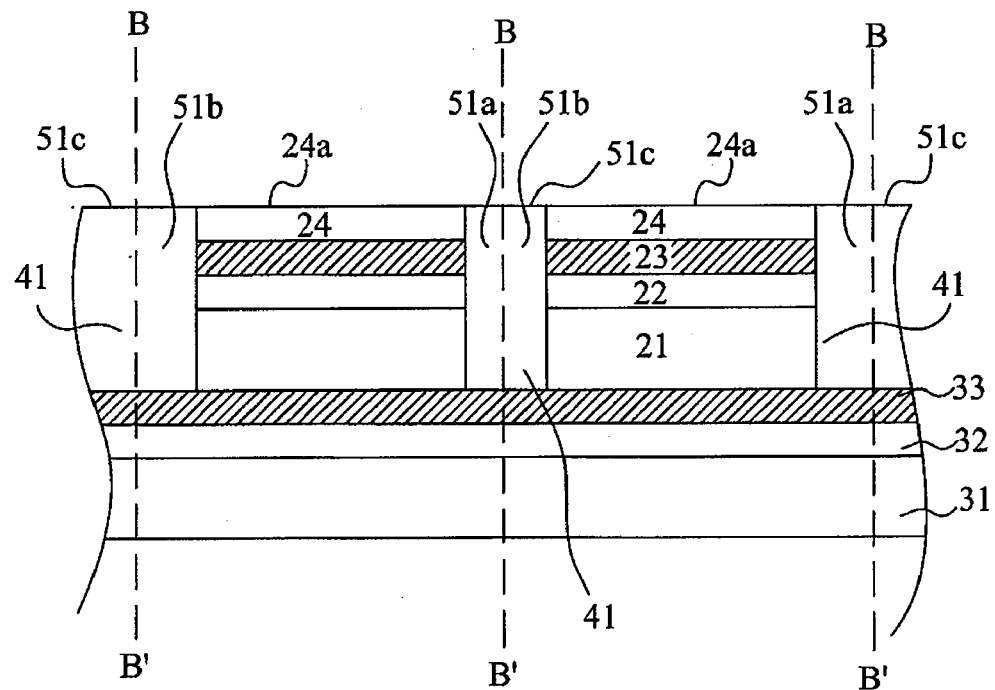

Thereafter, referring to FIG. 6, an appropriate conventional skill is utilized to polish the isolation layer 51 for exposing the upper surface 24a of the epitaxy chip 26. The upper surface 24a is that of the second conductive semiconductor layer 24. In one embodiment, the upper surface 51c of the isolation layer 51 and the upper surface 24a of the second conductive semiconductor layer 24 are coplanar after being polished.

Figure 7:
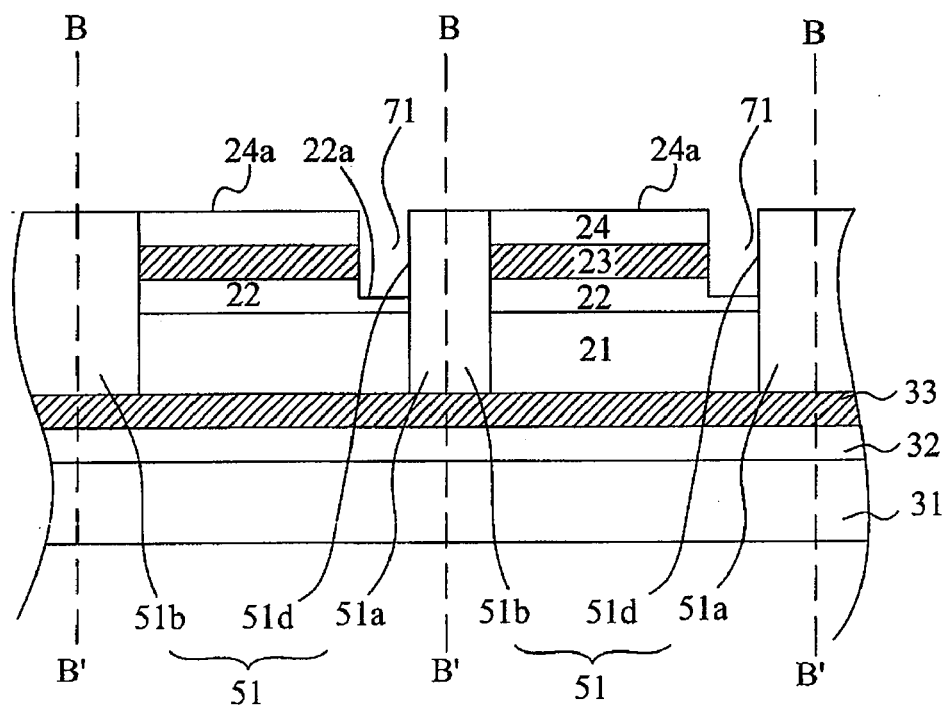

As shown in FIG. 7, after the polishing step, a trench 71 is formed in the epitaxy chip 26 by an appropriate photolithography skill for exposing the first conductive semiconductor layer 22. In one embodiment, the trench 71 further exposes a vertical sidewall 51d of the first portion 51a of the isolation layer 51.

Figure 8:
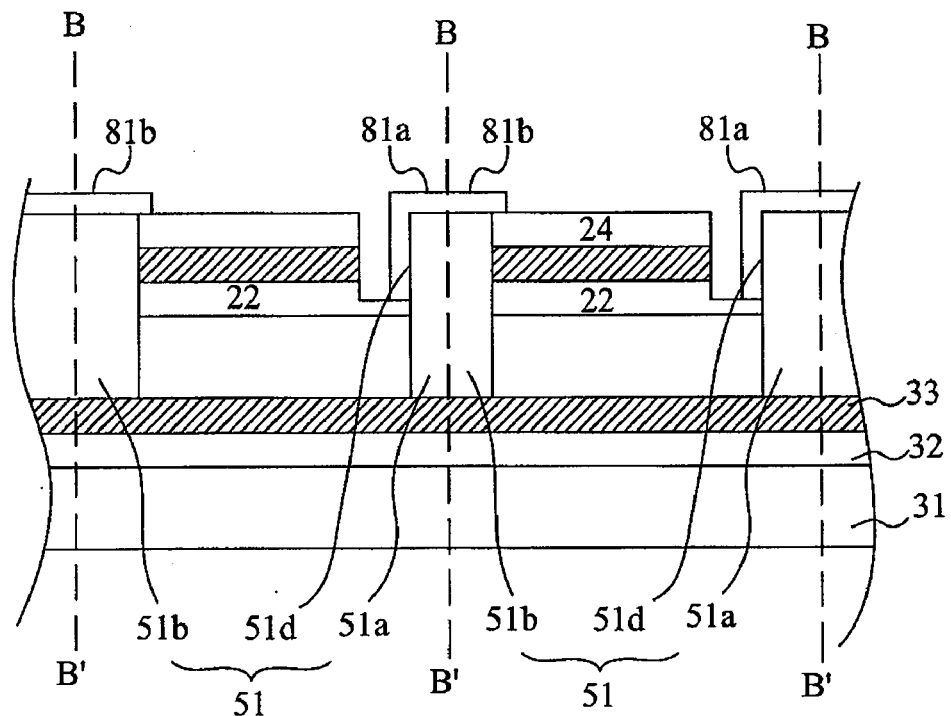

Next, referring to FIG. 8, the process proceeds to form a first transparent conductive layer 81a over the first portion 51a of the isolation layer 51 and a second transparent conductive layer 81b over the second portion 51b of the isolation layer 51, respectively, by appropriate deposition, printing or sputtering. Note that, in one embodiment, the first transparent conductive layer 81a extends downwards to cover the vertical sidewall 51d of the isolation layer 51, and substantially connects to the first conductive semiconductor layer 22. The second transparent conductive layer 81b extends outwards to substantially connect to the second conductive semiconductor layer 24. The first transparent conductive layer 81a and the second transparent conductive layer 81b can be formed simultaneously, and can be made of indium tin oxide, cadmium tin oxide, zinc oxide, or zinc tin oxide.

Figure 9:
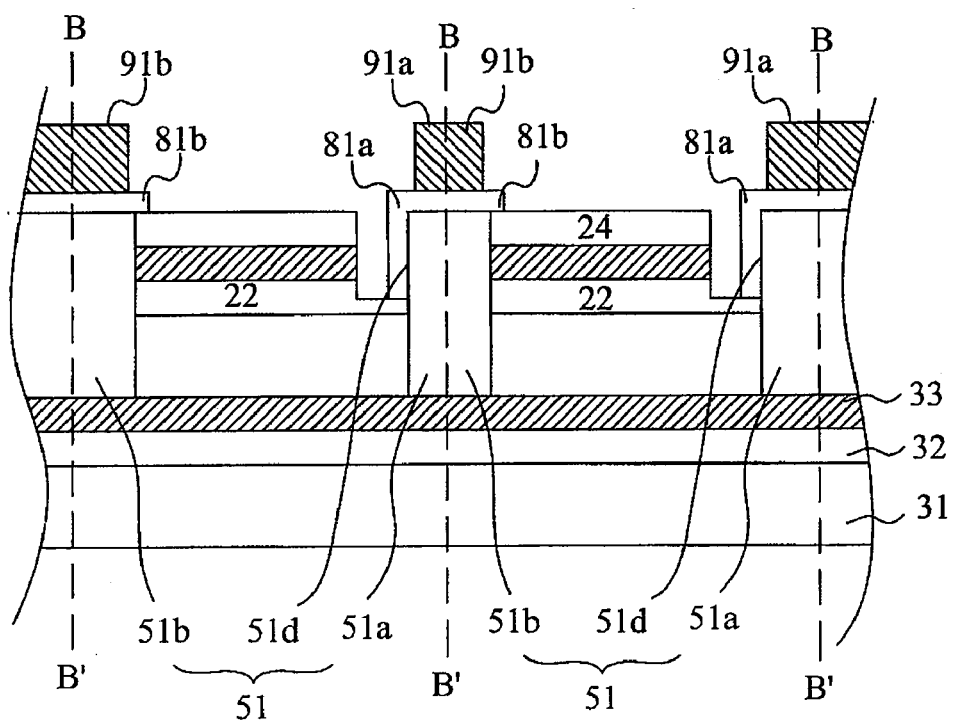

As shown in FIG. 9, the method then proceeds to form a first electrode 91a over the first portion 51a of the isolation layer 51 and a second electrode 91b over the second portion 51b of the isolation layer 51, respectively, by appropriate deposition, printing or sputtering. The electrodes 91a and 91b can be made of metal such as Au or Ni. The first electrode 91a electrically connects to the first conductive semiconductor layer 22 through the first transparent conductive layer 81a, and the second electrode 91b electrically connects to the second conductive semiconductor layer 24 through the second transparent conductive layer 81b. In other words, the first electrode 91a and the second electrode 91b are supported by the isolation layer 51, instead of being stacked directly on the epitaxy chip 26. As a result, in one embodiment, neither of the first electrode 91a nor the second electrode 91b covers the first conductive semiconductor layer 22 or second conductive semiconductor layer 24.

Figure 10:
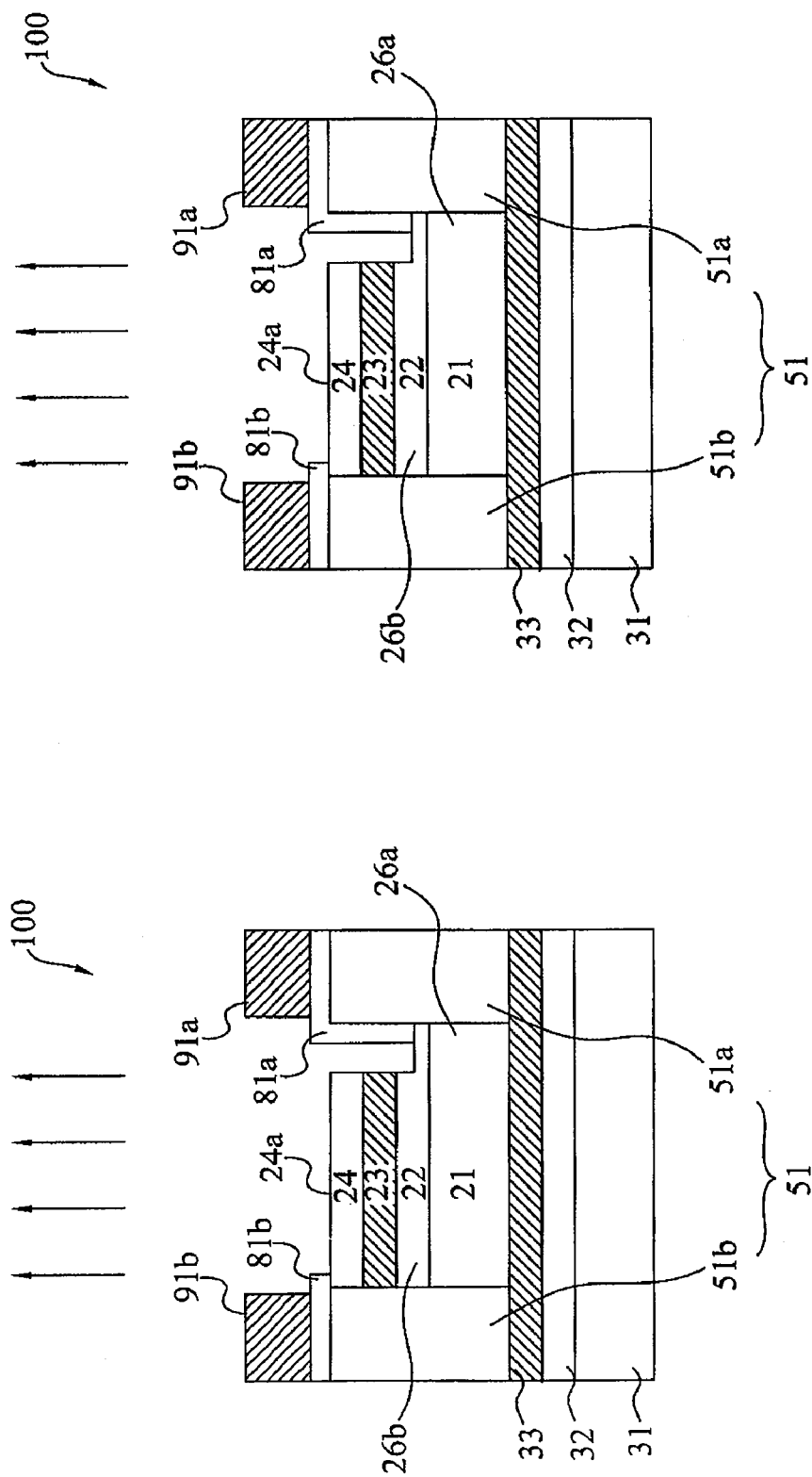

After formation of the first electrode 91a and the second electrode 91b, the process proceeds to cut the substrate 31 along the cutting line BB' in FIG. 9, and thus a plurality of light emitting diode devices 100 are formed, as shown in FIG. 10. The light emitting diode device 100 is a top-emitting light emitting diode device, and includes a substrate 21, a first conductive semiconductor layer 22, a light emitting layer 23, a conductive semiconductor layer 24, and an epitaxy chip 26. The epitaxy chip 26 is disposed over the other substrate 31, being connected to the isolation layer 51. In detail, the isolation layer 51 has a first portion 51a connecting to a first side 26a of the epitaxy chip 26 and a second portion 51b connecting to a second side 26b of the epitaxy chip 26. The light emitting diode device 100 has a first electrode 91a over the first portion 51a of the isolation layer 51 and a second electrode 91b over the second portion 51b of the isolation layer 51. The first electrode 91a electrically connects to the first conductive semiconductor layer 22 through the first transparent conductive layer 81a, and the second electrode 91b electrically connects to the second conductive semiconductor layer 24 through the second transparent conductive layer 81b. The first electrode 91a and second electrode 91b are on the same side of the light emitting layer 23.

Although specific embodiments have been illustrated and described, it will be obvious to those skilled in the art that various modifications may be made without departing from what is intended to be limited solely by the appended claims.

The invention claimed is:

1. A light emitting diode, comprising:
    an epitaxy chip having an epitaxial stack and a first substrate underlying the epitaxial stack, wherein the epitaxial stack has a first conductive semiconductor layer, a light emitting layer and a second conductive semiconductor layer;
    a second substrate holding the epitaxy chip;
    an isolation layer on the second substrate, the isolation layer having a first portion connecting to one side of the epitaxy chip and a second portion connecting to another side of the epitaxy chip;
    a first electrode on the first portion of the isolation layer; and
    a second electrode on the second portion of the isolation layer, wherein the first electrode and the second electrode respectively and electrically connects to the first conductive semiconductor layer and the second conductive semiconductor layer;
    wherein none of the first and second electrodes covers the first or second conductive semiconductor layer.

2. The light emitting diode of claim 1, wherein the first and second electrodes are disposed on the same side of the light emitting layer.

3. The light emitting diode of claim 1, wherein upper surfaces of the isolation layer and the second conductive semiconductor layer are coplanar.

4. The light emitting diode of claim 1, wherein the isolation layer is made of spin-on glass, silicon resin, benzocyclobutene, epoxy, polyimide, or prefluorocyclobutene.

5. The light emitting diode of claim 1, further comprising:
    a first transparent conductive layer over the first portion of the isolation layer, wherein the first transparent conductive layer connects to the first electrode and the first conductive semiconductor layer; and a second transparent conductive layer over the second portion of the isolation layer, wherein the second transparent conductive layer connects to the second electrode and the second conductive semiconductor layer.

6. The light emitting diode of claim 5, wherein the first portion of the isolation layer has a vertical sidewall, and the first transparent conductive layer covers the vertical sidewall.

7. The light emitting diode of claim 5, wherein the first and second transparent conductive layers are indium tin oxide, cadmium tin oxide, zinc oxide, or zinc tin oxide.

8. The light emitting diode of claim 1, wherein the isolation layer surrounds the epitaxy chip.

9. The light emitting diode of claim 1, further comprising: an adhesion layer between the first and second substrates.

10. The light emitting diode of claim 9, wherein the adhesion layer is made of spin-on glass, silicon resin, benzocyclobutene, epoxy, polyimide, or prefluorocyclobutene.

11. The light emitting diode of claim 1, further comprising: a reflection layer between the first and second substrates.

* * * * *